(12) United States Patent
Li et al.

(10) Patent No.: US 8,318,584 B2
(45) Date of Patent: Nov. 27, 2012

(54) OXIDE-RICH LINER LAYER FOR FLOWABLE CVD GAPFILL

(75) Inventors: DongQing Li, Fremont, CA (US);
Jingmei Liang, San Jose, CA (US);
Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 61 days.

(21) Appl. No.: 13/153,016

(22) Filed: Jun. 3, 2011

(65) Prior Publication Data

US 2012/0142192 A1    Jun. 7, 2012

Related U.S. Application Data

(60) Provisional application No. 61/369,352, filed on Jul. 30, 2010.

(51) Int. Cl.
*H01L 21/76* (2006.01)

(52) U.S. Cl. ........ 438/435; 438/424; 438/436; 438/437; 438/438; 438/700; 438/761; 438/763; 438/769; 438/772; 438/775; 438/778; 438/783; 438/787; 438/788; 257/760; 257/E21.271; 257/E21.277; 257/E21.278; 257/E21.545; 257/E21.546

(58) Field of Classification Search .................. None
See application file for complete search history.

(56) References Cited

U.S. PATENT DOCUMENTS

| | | |
|---|---|---|
| 4,147,571 A | 4/1979 | Stringfellow et al. |
| 4,816,098 A | 3/1989 | Davis et al. |
| 4,818,326 A | 4/1989 | Liu et al. |
| 4,931,354 A | 6/1990 | Wakino et al. |
| 5,016,332 A | 5/1991 | Reichelderfer et al. |

(Continued)

FOREIGN PATENT DOCUMENTS

DE    19654737 A1    7/1997

(Continued)

OTHER PUBLICATIONS

Aylett, B. J. et al., "Silicon-Nitrogen Compounds. Part V. Diphenylamino-derivatives of Silane," J. Chem. Soc. (A), 1969, pp. 636-638.

(Continued)

*Primary Examiner* — Julio J Maldonado
*Assistant Examiner* — Yasser Abdelaziez
(74) *Attorney, Agent, or Firm* — Kilpatrick Townsend & Stockton LLP

(57) ABSTRACT

The formation of a gap-filling silicon oxide layer with reduced volume fraction of voids is described. The deposition involves the formation of an oxygen-rich less-flowable liner layer before an oxygen-poor more-flowable gapfill layer. However, the liner layer is deposited within the same chamber as the gapfill layer. The liner layer and the gapfill layer may both be formed by combining a radical component with an unexcited silicon-containing precursor (i.e. not directly excited by application of plasma power). The liner layer has more oxygen content than the gapfill layer and deposits more conformally. The deposition rate of the gapfill layer may be increased by the presence of the liner layer. The gapfill layer may contain silicon, oxygen and nitrogen and be converted at elevated temperature to contain more oxygen and less nitrogen. The presence of the gapfill liner provides a source of oxygen underneath the gapfill layer to augment the gas phase oxygen introduced during the conversion.

15 Claims, 6 Drawing Sheets

U.S. PATENT DOCUMENTS

| | | |
|---|---|---|
| 5,110,407 A | 5/1992 | Ono et al. |
| 5,271,972 A | 12/1993 | Kwok et al. |
| 5,393,708 A | 2/1995 | Hsia et al. |
| 5,426,076 A | 6/1995 | Moghadam |
| 5,558,717 A | 9/1996 | Zhao et al. |
| 5,587,014 A | 12/1996 | Leychika et al. |
| 5,622,784 A | 4/1997 | Okaue et al. |
| 5,635,409 A | 6/1997 | Moslehi |
| 5,665,643 A | 9/1997 | Shin |
| 5,691,009 A | 11/1997 | Sandhu |
| 5,786,263 A | 7/1998 | Perera |
| 5,853,607 A | 12/1998 | Zhao et al. |
| 5,935,340 A | 8/1999 | Xia et al. |
| 5,937,308 A | 8/1999 | Gardner et al. |
| 5,937,323 A | 8/1999 | Orczyk et al. |
| 6,008,515 A | 12/1999 | Hsia et al. |
| 6,009,830 A | 1/2000 | Li et al. |
| 6,024,044 A | 2/2000 | Law et al. |
| 6,087,243 A | 7/2000 | Wang |
| 6,090,723 A | 7/2000 | Thakur et al. |
| 6,114,219 A | 9/2000 | Spikes et al. |
| 6,140,242 A | 10/2000 | Oh et al. |
| 6,146,970 A | 11/2000 | Witek et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,207,587 B1 | 3/2001 | Li et al. |
| 6,287,962 B1 | 9/2001 | Lin |
| 6,302,964 B1 | 10/2001 | Umotoy et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,448,187 B2 | 9/2002 | Yau et al. |
| 6,503,557 B1 | 1/2003 | Joret |
| 6,506,253 B2 | 1/2003 | Sakuma |
| 6,508,879 B1 | 1/2003 | Hashimoto |
| 6,509,283 B1 | 1/2003 | Thomas |
| 6,524,931 B1 | 2/2003 | Perera |
| 6,528,332 B2 | 3/2003 | Mahanpour et al. |
| 6,544,900 B2 | 4/2003 | Raaijmakers et al. |
| 6,548,416 B2 | 4/2003 | Han et al. |
| 6,548,899 B2 | 4/2003 | Ross |
| 6,559,026 B1 | 5/2003 | Rossman et al. |
| 6,566,278 B1 | 5/2003 | Harvey et al. |
| 6,589,868 B2 | 7/2003 | Rossman |
| 6,596,654 B1 | 7/2003 | Bayman et al. |
| 6,602,806 B1 | 8/2003 | Xia et al. |
| 6,614,181 B1 | 9/2003 | Harvey et al. |
| 6,624,064 B1 | 9/2003 | Sahin et al. |
| 6,630,413 B2 | 10/2003 | Todd |
| 6,645,303 B2 | 11/2003 | Frankel et al. |
| 6,660,391 B1 | 12/2003 | Rose et al. |
| 6,676,751 B2 | 1/2004 | Solomon et al. |
| 6,683,364 B2 | 1/2004 | Oh et al. |
| 6,716,770 B2 | 4/2004 | O'Neill et al. |
| 6,756,085 B2 | 6/2004 | Waldfried et al. |
| 6,762,126 B2 | 7/2004 | Cho et al. |
| 6,787,191 B2 | 9/2004 | Hanahata et al. |
| 6,794,290 B1 | 9/2004 | Papasouliotis et al. |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,835,278 B2 | 12/2004 | Selbrede et al. |
| 6,858,523 B2 | 2/2005 | Deboer et al. |
| 6,867,086 B1 | 3/2005 | Chen et al. |
| 6,872,323 B1 | 3/2005 | Entley et al. |
| 6,890,403 B2 | 5/2005 | Cheung |
| 6,900,067 B2 | 5/2005 | Kobayashi et al. |
| 6,955,836 B2 | 10/2005 | Kumagai et al. |
| 6,958,112 B2 | 10/2005 | Karim et al. |
| 7,018,902 B2 | 3/2006 | Visokay et al. |
| 7,084,076 B2 | 8/2006 | Park et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,176,144 B1 | 2/2007 | Wang et al. |
| 7,183,177 B2 | 2/2007 | Al-Bayati et al. |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,335,609 B2 | 2/2008 | Ingle et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,745,352 B2 | 6/2010 | Mallick et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |
| 7,867,923 B2 | 1/2011 | Mallick et al. |
| 7,902,080 B2 | 3/2011 | Chen et al. |
| 7,935,643 B2 | 5/2011 | Liang et al. |
| 7,943,531 B2 | 5/2011 | Nemani et al. |
| 7,989,365 B2 | 8/2011 | Park et al. |
| 7,994,019 B1 | 8/2011 | Kweskin et al. |
| 2001/0021595 A1 | 9/2001 | Jang |
| 2001/0029114 A1 | 10/2001 | Vulpio et al. |
| 2001/0038919 A1 | 11/2001 | Berry et al. |
| 2001/0054387 A1 | 12/2001 | Frankel et al. |
| 2002/0048969 A1 | 4/2002 | Suzuki et al. |
| 2002/0081817 A1 | 6/2002 | Bhakta et al. |
| 2002/0127350 A1 | 9/2002 | Ishikawa et al. |
| 2002/0142585 A1 | 10/2002 | Mandal |
| 2002/0146879 A1 | 10/2002 | Fu et al. |
| 2002/0164891 A1 | 11/2002 | Gates et al. |
| 2003/0040199 A1 | 2/2003 | Agarwal |
| 2003/0064154 A1 | 4/2003 | Laxman et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0199151 A1 | 10/2003 | Ho et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0048492 A1 | 3/2004 | Ishikawa et al. |
| 2004/0065253 A1 | 4/2004 | Pois et al. |
| 2004/0079118 A1 | 4/2004 | M'Saad et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0175501 A1 | 9/2004 | Lukas et al. |
| 2004/0180557 A1 | 9/2004 | Park et al. |
| 2004/0185641 A1 | 9/2004 | Tanabe et al. |
| 2004/0219780 A1 | 11/2004 | Ohuchi |
| 2004/0231590 A1 | 11/2004 | Ovshinsky |
| 2004/0241342 A1 | 12/2004 | Karim et al. |
| 2005/0001556 A1 | 1/2005 | Hoffman et al. |
| 2005/0019494 A1 | 1/2005 | Moghadam et al. |
| 2005/0026443 A1 | 2/2005 | Goo et al. |
| 2005/0062165 A1 | 3/2005 | Saenger et al. |
| 2005/0087140 A1 | 4/2005 | Yuda et al. |
| 2005/0118794 A1 | 6/2005 | Babayan et al. |
| 2005/0142895 A1 | 6/2005 | Ingle et al. |
| 2005/0153574 A1 | 7/2005 | Mandal |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0227499 A1 | 10/2005 | Park et al. |
| 2005/0250340 A1 | 11/2005 | Chen et al. |
| 2005/0260347 A1 | 11/2005 | Narwankar et al. |
| 2006/0011984 A1 | 1/2006 | Curie |
| 2006/0014399 A1 | 1/2006 | Joe |
| 2006/0030165 A1 | 2/2006 | Ingle et al. |

| | | | |
|---|---|---|---|
| 2006/0046506 A1 | 3/2006 | Fukiage | |
| 2006/0055004 A1 | 3/2006 | Gates et al. | |
| 2006/0068599 A1 | 3/2006 | Baek et al. | |
| 2006/0075966 A1 | 4/2006 | Chen et al. | |
| 2006/0091451 A1* | 5/2006 | Yamaguchi et al. | 257/316 |
| 2006/0096540 A1 | 5/2006 | Choi | |
| 2006/0110943 A1 | 5/2006 | Swerts et al. | |
| 2006/0121394 A1 | 6/2006 | Chi | |
| 2006/0162661 A1 | 7/2006 | Jung et al. | |
| 2006/0178018 A1 | 8/2006 | Olsen | |
| 2006/0223315 A1 | 10/2006 | Yokota et al. | |
| 2006/0228903 A1 | 10/2006 | McSwiney et al. | |
| 2006/0252240 A1 | 11/2006 | Gschwandtner et al. | |
| 2006/0281496 A1 | 12/2006 | Cedraeus | |
| 2006/0286776 A1 | 12/2006 | Ranish et al. | |
| 2007/0020392 A1 | 1/2007 | Kobrin et al. | |
| 2007/0026689 A1 | 2/2007 | Nakata et al. | |
| 2007/0031598 A1 | 2/2007 | Okuyama et al. | |
| 2007/0049044 A1 | 3/2007 | Marsh | |
| 2007/0077777 A1 | 4/2007 | Gumpher | |
| 2007/0092661 A1 | 4/2007 | Ryuzaki et al. | |
| 2007/0128864 A1 | 6/2007 | Ma et al. | |
| 2007/0134433 A1 | 6/2007 | Dussarrat et al. | |
| 2007/0166892 A1 | 7/2007 | Hori | |
| 2007/0173073 A1 | 7/2007 | Weber | |
| 2007/0181966 A1 | 8/2007 | Watatani et al. | |
| 2007/0232071 A1 | 10/2007 | Balseanu et al. | |
| 2007/0232082 A1 | 10/2007 | Balseanu et al. | |
| 2007/0275569 A1 | 11/2007 | Moghadam et al. | |
| 2007/0281495 A1 | 12/2007 | Mallick et al. | |
| 2007/0281496 A1 | 12/2007 | Ingle et al. | |
| 2008/0000423 A1 | 1/2008 | Fukiage | |
| 2008/0085607 A1 | 4/2008 | Yu et al. | |
| 2008/0102223 A1 | 5/2008 | Wagner et al. | |
| 2008/0102650 A1 | 5/2008 | Adams et al. | |
| 2008/0188087 A1 | 8/2008 | Chen et al. | |
| 2008/0206954 A1 | 8/2008 | Choi et al. | |
| 2008/0260969 A1 | 10/2008 | Dussarrat et al. | |
| 2008/0318429 A1 | 12/2008 | Ozawa et al. | |
| 2009/0035917 A1 | 2/2009 | Ahn et al. | |
| 2009/0053901 A1 | 2/2009 | Goto et al. | |
| 2009/0061647 A1 | 3/2009 | Mallick et al. | |
| 2009/0096055 A1* | 4/2009 | Montgomery et al. | 257/510 |
| 2009/0104755 A1 | 4/2009 | Mallick et al. | |
| 2009/0104790 A1 | 4/2009 | Liang | |
| 2009/0203225 A1 | 8/2009 | Gates et al. | |
| 2009/0325391 A1 | 12/2009 | De Vusser et al. | |
| 2010/0148301 A1* | 6/2010 | Matsuda et al. | 257/510 |
| 2010/0221925 A1 | 9/2010 | Lee et al. | |
| 2011/0014798 A1 | 1/2011 | Mallick et al. | |
| 2011/0034035 A1 | 2/2011 | Liang et al. | |
| 2011/0034039 A1 | 2/2011 | Liang et al. | |
| 2011/0045676 A1 | 2/2011 | Park et al. | |
| 2011/0111137 A1 | 5/2011 | Liang et al. | |
| 2011/0129616 A1 | 6/2011 | Ingle et al. | |
| 2011/0136347 A1 | 6/2011 | Kovarsky et al. | |

FOREIGN PATENT DOCUMENTS

| | | |
|---|---|---|
| EP | 0892083 A1 | 1/1999 |
| EP | 1717848 A | 11/2006 |
| JP | 01241826 A | 9/1989 |
| KR | 10-2004-0091978 A | 11/2004 |
| KR | 10-2005-0003758 A | 1/2005 |
| KR | 10-2005-0094183 A | 9/2005 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |

OTHER PUBLICATIONS

Aylett, B. J. et al., "Silicon-Nitrogen Compounds. Part VI.[1] The Preparation and Properties of Disilazane," J. Chem. Soc. (A), 1969, pp. 639-642.

Aylett, B. J. et al., "The Preparation and Some Properties of Disilylamine-Correspondence," Inorganic Chemistry, 1966, p. 167.

Beach, David B., "Infrared and Mass Spectroscopic Study of the Reaction of Silyl iodide and Ammonia. Infrared Spectrum to Silylamine," inorganic Chemistry, 1992, pp. 4174-4177, vol. 31 No. 20.

Burg, Anton B. et al., "Silyl-Amino Boron Compounds," J. Amer. Chem. Soc., Jul. 1950, pp. 3103-3107, vol. 72.

Coltrin, M.E., et al., "Chemistry of AlGaN Particulate Formation," National Nuclear Security Administration, Physical, Chemical, & Nano Sciences Center, Research Briefs, 2005, pp. 42-43.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Gulleri, G. et al., "Deposition Temperature Determination of HDPCVD Silicon Dioxide Films," 2005, Microelectronic Engineering, vol. 82, pp. 236-241.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

Lee, Eun Gu, et al., "Effects of Wet Oxidation on the Electrical Properties of sub-10 nm thick silicon nitride films", Thin Solid Films, Elsevier-Sequoia S.A. Lausanne, Ch. vol. 205, No. 2, Dec., 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, May-Jun. (1986), pp. 681-688.

Norman, Arlan D. et al., "Reaction of Silylphosphine with Ammonia," Inoragnic Chemistry, 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Ward, L. G. L. et al., , "The Preparation and Properties of *Bis*-Disilanyl Sulphide and *Tris*-Disilanylamine," J. Inorg. Nucl. Chem., 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159-170, vol. 11.

Zuckerman, J.J., "Inorganic Reactions and Methods," Formation of Bonds to N, P, As, Sb, Bi (Part 1), ISBN-0-89573-250-5, 1998, 5 pages, vol. 7, VCH Publishers, Inc., New York.

* cited by examiner

OXIDE-RICH LINER LAYER FOR FLOWABLE CVD GAPFILL

CROSS-REFERENCES TO RELATED APPLICATIONS

This application claims the benefit of U.S. Provisional Application No. 61/369,352 by Li et al, filed Jul. 30, 2010 and titled "OXIDE-RICH LINER LAYER FOR FLOWABLE CVD GAPFILL" which is incorporated herein in its entirety for all purposes.

BACKGROUND OF THE INVENTION

Semiconductor device geometries have dramatically decreased in size since their introduction several decades ago. Modern semiconductor fabrication equipment routinely produces devices with 45 nm, 32 nm, and 28 nm feature sizes, and new equipment is being developed and implemented to make devices with even smaller geometries. The decreasing feature sizes result in structural features on the device having decreased spatial dimensions. The widths of gaps and trenches on the device narrow to a point where the aspect ratio of gap depth to its width becomes high enough to make it challenging to fill the gap with dielectric material. The depositing dielectric material is prone to clog at the top before the gap completely fills, producing a void, or seam in the middle of the gap.

Over the years, many techniques have been developed to avoid having dielectric material clog the top of a gap, or to "heal" the void or seam that has been formed. One approach has been to start with highly flowable precursor materials that may be applied in a liquid phase to a spinning substrate surface (e.g., SOG deposition techniques). These flowable precursors can flow into and fill very small substrate gaps without forming voids or weak seams. However, once these highly flowable materials are deposited, they have to be hardened into a solid dielectric material.

In many instances, the hardening process includes a heat treatment to remove carbon and hydroxyl groups from the deposited material to leave behind a solid dielectric such as silicon oxide. Unfortunately, the departing carbon and hydroxyl species often leave behind pores in the hardened dielectric that reduce the quality of the final material. In addition, the hardening dielectric also tends to shrink in volume, which can leave cracks and spaces at the interface of the dielectric and the surrounding substrate. In some instances, the volume of the hardened dielectric can decrease by 40% or more.

Thus, there is a need for new deposition processes and materials to form dielectric materials on structured substrates without generating voids, seams, or both, in substrate gaps and trenches. There is also a need for materials and methods of hardening flowable dielectric materials with fewer pores and less shrinkage as well as accommodating the shrinkage which still occurs. This and other needs are addressed in the present application.

BRIEF SUMMARY OF THE INVENTION

The formation of a gap-filling silicon oxide layer with reduced volume fraction of voids is described. The deposition involves the formation of an oxygen-rich less-flowable liner layer before an oxygen-poor more-flowable gapfill layer. However, the liner layer is deposited within the same chamber as the gapfill layer. The liner layer and the gapfill layer may both be formed by combining a radical component with an unexcited silicon-containing precursor (i.e. not directly excited by application of plasma power). The liner layer has more oxygen content than the gapfill layer and deposits more conformally. The deposition rate of the gapfill layer may be increased by the presence of the liner layer. The gapfill layer may contain silicon, oxygen and nitrogen and be converted at elevated temperature to contain more oxygen and less nitrogen. The presence of the gapfill liner provides a source of oxygen underneath the gapfill layer to augment the gas phase oxygen introduced during the conversion.

Embodiments of the invention include methods of forming a silicon oxide layer on a patterned substrate containing a trench. The methods include transferring the substrate into a substrate processing chamber and then forming an oxygen-rich liner layer on the substrate including in the trench. The methods further include forming a gapfill dielectric layer on the substrate and in the trench. The gapfill dielectric layer has a lower oxygen content than the oxygen-rich liner layer and the gapfill dielectric layer is flowable during formation. The methods further include curing the gapfill dielectric layer at an elevated temperature to transfer some of the oxygen from the oxygen-rich liner layer into the gapfill dielectric layer.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

The formation of a gap-filling silicon oxide layer with reduced volume fraction of voids is described. The deposition involves the formation of an oxygen-rich less-flowable liner layer before an oxygen-poor more-flowable gapfill layer. However, the liner layer is deposited within the same chamber as the gapfill layer. The liner layer and the gapfill layer may both be formed by combining a radical component with an unexcited silicon-containing precursor (i.e. not directly excited by application of plasma power). The liner layer has more oxygen content than the gapfill layer and deposits more conformally. The deposition rate of the gapfill layer may be increased by the presence of the liner layer. The gapfill layer may contain silicon, oxygen and nitrogen and be converted at elevated temperature to contain more oxygen and less nitrogen. The presence of the gapfill liner provides a source of oxygen underneath the gapfill layer to augment the gas phase oxygen introduced during the conversion.

DETAILED DESCRIPTION OF THE INVENTION

The formation of a gap-filling silicon oxide layer with reduced tendency towards cracking is described. The deposition involves the formation of a flowable silicon-containing layer which facilitates the filling of trenches. Subsequent processing at high substrate temperature causes less cracking in the dielectric film than flowable films formed in accordance with methods in the prior art. A compressive liner layer deposited prior to the formation of the gap-filling silicon oxide layer is described and reduces the tendency for the subsequently deposited film to crack. A compressive capping layer deposited after a flowable silicon-containing layer has also been determined to reduce cracking. Compressive liner layers and compressive capping layers can be used alone or in combination to reduce cracking. Compressive capping layers in disclosed embodiments have additionally been determined to enable an underlying layer of silicon nitride to be transformed into a silicon oxide layer.

Inclusion of a liner layer having greater oxygen content than a subsequent gapfill layer provides another source of oxygen below the gapfill layer for use during the conversion of the gapfill layer to silicon oxide. Flowable films may require curing either as a distinct curing step or as a natural by-product of heating a film stack including the gap-filling film during subsequent processing. Curing may be accomplished in an oxygen-containing environment from which oxygen migrates into the gapfill layer and displaces components which were necessary to enable the gapfill layer to flow into trenches on a patterned substrate. Those components may be removed once the gapfill layer has filled the trench. Curing displaces these components with oxygen, some of which now diffuses from the oxide-rich liner layer into the gapfill layer.

Figure 1:
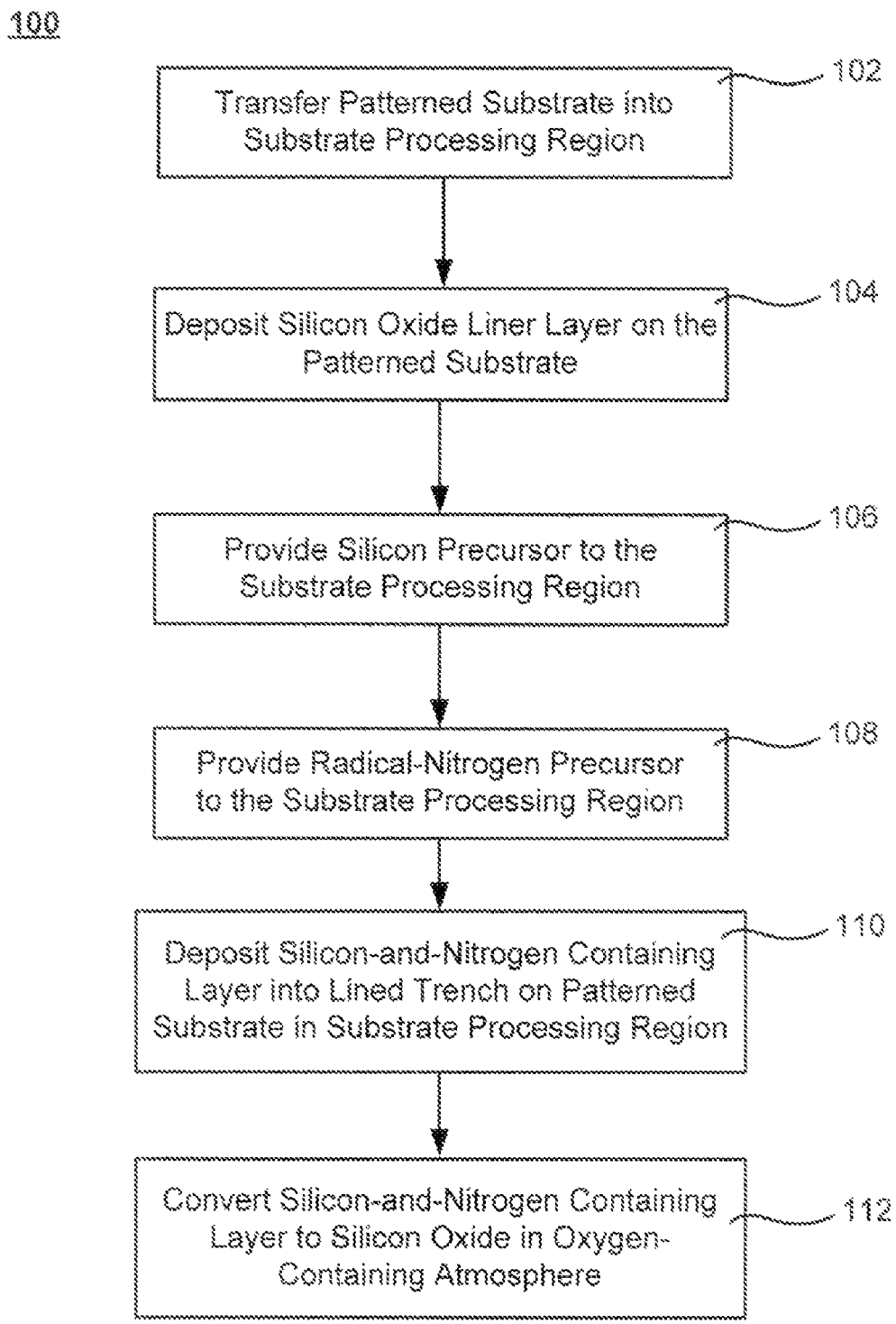
FIG. 1 is a flowchart illustrating selected steps for making reduced-void silicon oxide gapfill dielectric layers according to disclosed embodiments.
Figure 2:
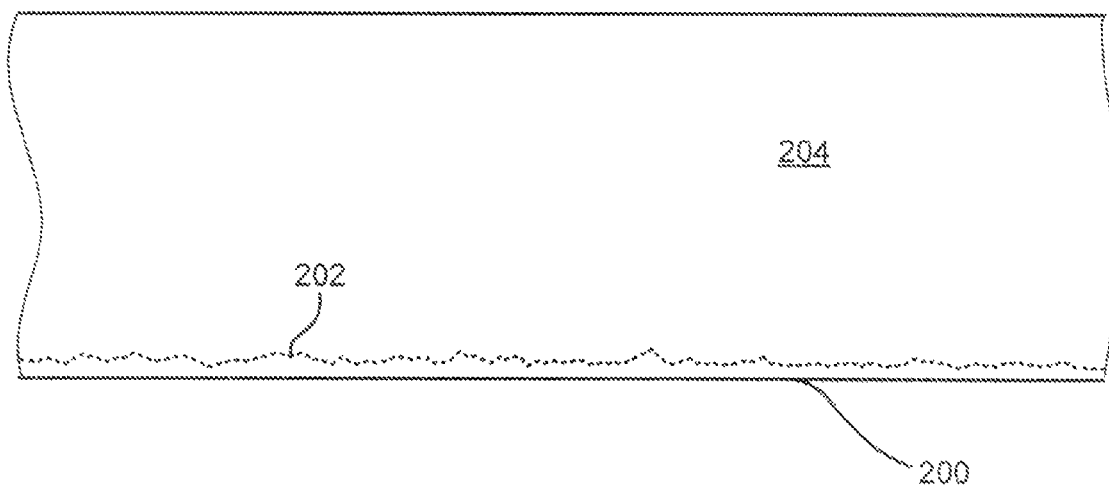
FIG. 2 is a cross-sectional view of a multi-layer dielectric film according to disclosed embodiments.
Figure 3A:
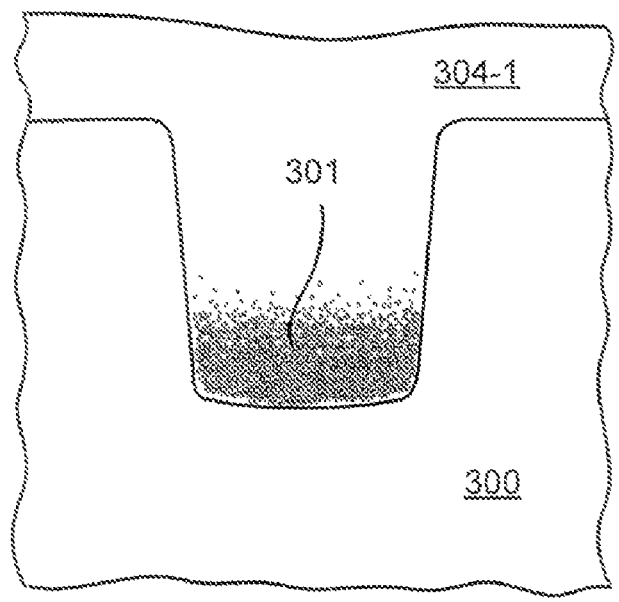
FIG. 3A is a cross-sectional view of silicon-oxide gapfill without an oxide-rich, liner layer according to disclosed embodiments.
Figure 3B:
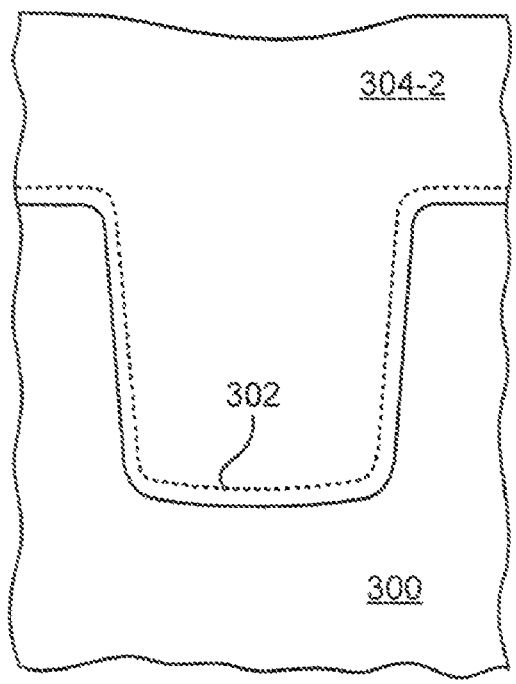
FIG. 3B is a cross-sectional view of silicon-oxide gapfill with an oxide-rich liner layer according to disclosed embodiments.

In order to better understand and appreciate the invention, reference is now made to FIGS. 1-3 which are a flowchart showing selected steps for using oxide-rich liner layers and cross-sectional views of structures which incorporate oxide-rich liner layers according to embodiments of the invention. The method 100 includes transferring a patterned substrate having a trench into a substrate processing region 102. In the example, a silicon oxide liner layer is deposited on the patterned substrate 104. FIG. 2 shows an oxide-rich liner grown out to dotted line 202 from substrate 200. FIG. 3B shows an oxide-rich liner grown to dotted line 302 on a trench in a patterned substrate 300. After the liner layer is deposited, a gapfill dielectric layer is grown by CVD in steps 106-110. The gapfill dielectric layer is flowable during formation in order to facilitate filling the trench more fully. The gapfill dielectric layer 204, 304-2 is depicted in each of FIGS. 2 and 3B. The oxide-rich liner layer is more conformal than the gapfill dielectric layer and may be generally conformal, in some disclosed embodiments. The gapfill dielectric layer may substantially fill the trench.

A variety of methods can be used to deposit gapfill dielectric layers which are flowable during formation. In the example of FIG. 1, a silicon precursor is introduced to the substrate processing region housing the substrate 106. Another precursor is introduced only after passing through a remote plasma region to create a "radical-nitrogen" precursor, which is then flowed into the substrate processing region 108 and combined with the silicon precursor. The silicon-containing precursor is not directly excited by an application of plasma power. In other words, plasma power is not applied to excite a plasma in the substrate processing region. This arrangement results in the flowable deposition of a silicon-and-nitrogen-containing layer into the lined trench 110. The flowability of the film attenuates as the deposition proceeds and the flowability is essentially removed during a curing operation. The curing operation involves converting the silicon-and-nitrogen-containing layer to silicon oxide 112. Curing involves raising the patterned substrate temperature and exposing the gapfill dielectric layer to an oxygen-containing environment. The oxygen content of the oxide-rich liner layer is greater than that of the silicon-and-nitrogen-containing gapfill layer. The elevated temperature induces the oxide to diffuse from the' liner layer into the gapfill layer which provides an additional source of oxygen from underneath the gapfill dielectric layer.

Radical-component CVD is used to form the oxide-rich liner and the gapfill layer, in disclosed embodiments. The two operations are performed in the same; substrate processing region to reduce cost-of-ownership, increase throughput and maintain the integrity of the interface. The silicon-containing precursor may contain carbon or nitrogen in order to ensure flowability during gapfill dielectric layer formation. In disclosed embodiments, the silicon-containing precursor is a carbon-free silicon-containing precursor which enables the gapfill layer to undergo less shrinkage during the curing process. The carbon-free silicon precursor may be, for example, a silicon-and-nitrogen precursor, a silicon-and-hydrogen precursor, or a silicon-nitrogen-and-hydrogen containing precursor, among other classes of silicon precursors. Specific examples of these precursors may include silyl-amines such as $H_2N(SiH_3)$, $HN(SiH_3)_2$, and $N(SiH_3)_3$, among other silyl-amines. These silyl-amines may be mixed with additional gases that may act as carrier gases, reactive gases, or both. Examples of the these additional gases may include $H_2$, $N_2$, $NH_3$, He, and Ar, among other gases. Examples of carbon-free silicon precursors may also include silane ($SiH_4$) either alone or mixed with other silicon (e.g., $N(SiH_3)_3$), hydrogen (e.g., $H_2$), and/or nitrogen (e.g., $N_2$, $NH_3$) containing gases. The silicon-containing precursors may also include silicon compounds that have no carbon or nitrogen, such as silane, disilane, etc. If the deposited oxide film is a doped oxide film, dopant precursors may also be used such as TEB, TMB, $B_2H_6$, TEPO, $PH_3$, $P_2H_6$, and TMP, among other boron and phosphorous dopants.

Nitrogen may be included in either or both of the radical precursor and the silicon-containing precursor. When nitrogen is present in the radical precursor, it may be referred to as a radical-nitrogen precursor. The radical-nitrogen precursor includes plasma effluents created by exciting a more stable nitrogen-containing precursor in a plasma. For example, a relatively stable nitrogen-containing precursor containing $NH_3$ and/or hydrazine ($N_2H_4$) may be activated in a chamber plasma region or a remote plasma system (RPS) outside the processing chamber to form the radical-nitrogen precursor, which is then transported into a plasma-free substrate processing region. The stable nitrogen precursor may also be a mixture comprising $NH_3$ & $N_2$, $NH_3$ & $H_2$, $NH_3$ & $N_2$ & $H_2$ and $N_2$ & $H_2$, in different embodiments. Hydrazine may also be used in place of or in combination with $NH_3$ in the mixtures with $N_2$ and $H_2$. The flow rate of the stable nitrogen precursor may be greater than or about 200 sccm, greater than or about 300 sccm, greater than or about 500 sccm or greater than or about 700 sccm in different embodiments. Nitrogen-containing precursors may also include $N_2O$, NO, $NO_2$ and $NH_4OH$. The radical-nitrogen precursor produced may include one or more of .N, .NH, .NH$_2$, etc., and may also be accompanied by ionized species formed in the plasma. In other embodiments, the radical-nitrogen precursor is generated in a section of the processing chamber partitioned from the substrate processing region where the precursors mix and react to deposit the silicon-and-nitrogen layer on a deposition substrate (e.g., a semiconductor wafer). The partition may be interchangeably referred to as a showerhead. The radical-nitrogen precursor may also be accompanied by a carrier gas such as argon, helium, etc. Oxygen may be simultaneously delivered into the remote plasma region (in the form of $O_2$ and/or $O_3$) to adjust the amount of oxygen content in the radical-nitrogen precursor and liner or gapfill layer deposited with this technique.

Trenches may be difficult to fill without forming voids or seams using less flowable films produced with prior art gap-filling techniques such as HDP-CVD. The trenches may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths that range from about 90 nm to about 22 nm or less (e.g., about 90 nm, 65 nm, 45 nm, 32 nm, 22 nm, 16 nm, etc.). These restrictive geometries are not completely filled by the deposition of conventional silicon nitride ($Si_3N_4$) films. The deposited silicon-and-nitrogen containing film has flowable characteristics allowing it to flow into narrow gaps trenches and other structures on the deposition surface of the substrate. Because the layer is flowable, it can fill gaps with high aspect ratios without creating voids or weak seams around the center of the filling material. For example, a depositing flowable material is less likely to prematurely clog the top of the gap before it is completely filled. This may help to reduce or eliminate voids which remain in the middle of the gap.

The flowability may be due, at least in part, to a significant hydrogen component in, the deposited film. For example the deposited film may have a silazane-type, Si—NH—Si backbone (i.e., a Si—N—H film). Flowability may also result from short chained polymers of the silazane type. The nitrogen which, allows the formation of short chained polymers and flowability may originate from either the radical precursor or the silicon-containing precursor. When both the silicon precursor and the radical-nitrogen precursor, are carbon-free, the deposited silicon-and-nitrogen-containing film is also substantially carbon-free. Of course, "carbon-free" does not necessarily mean the film lacks even trace amounts of carbon. Carbon contaminants may be present in the precursor materials that find their way into the deposited silicon-and-nitrogen-containing film. The amount of these carbon impurities however are much, less than would be found in a silicon precursor having a carbon moiety (e.g., TEOS, TMDSO, etc.).

Following the deposition of the silicon-and-nitrogen containing layer; the deposition substrate may be exposed to an oxygen-containing atmosphere 112. The deposition substrate may remain in the reaction chamber when the oxygen-containing atmosphere is introduced, or the substrate may be transferred to a different chamber where the oxygen-containing atmosphere is introduced. The oxygen-containing atmosphere may include one or more oxygen containing gases such as molecular oxygen ($O_2$), ozone ($O_3$), water vapor ($H_2O$), an nitrogen-oxides (NO, $NO_2$, etc.), among other oxygen-containing gases. The oxygen-containing atmosphere may also include radical oxygen and hydroxyl species such as atomic oxygen (O), hydroxides (OH), etc., that may be generated remotely and transported into the substrate chamber. Ions of oxygen-containing species may also be present.

The oxygen-containing atmosphere provides oxygen to convert the silicon-and-nitrogen containing film into the silicon oxide ($SiO_2$) film 112. As noted previously, the lack of carbon in the silicon-and-nitrogen containing film results in significantly fewer pores formed in the final silicon oxide film. The net shrinkage from deposition to anneal is reduced by depositing a flowable silicon-and-nitrogen-containing film and converting to silicon oxide as opposed to depositing, a flowable silicon-and-oxygen-containing film initially. During the conversion process, the substrate temperature may range from about 25° C. to about 1100° C. (e.g., about 200° C., about 300° C., about 400° C., about 500° C., about 600° C., about 700° C., about 800° C., about 900° C., about 1000° C., etc.). In many cases, the volume reduction is slight enough (e.g., about 1.5 vol. % or less) to avoid post heat treatment steps to fill, heal, or otherwise address seams or spaces that form in the gap as a result of the shrinking silicon oxide. In an embodiment, the conversion may occur in two parts. The two part conversion may include a low temperature ozone cure (eg. between 200° C. and about 400° C.) to initiate the oxidation followed by a high temperature anneal in an oxygen-containing environment. During these operations, oxygen from the oxygen-rich liner layer diffuses into the gapfill silicon-and-nitrogen-containing layer in order to more fully convert the gapfill layer. Nitrogen may still be present within the gapfill layer, however, the gapfill material consists essentially of silicon and oxygen, in disclosed embodiments.

The process of FIG. 1 describes a process wherein silicon oxide is formed by first depositing a silicon-nitrogen-containing layer and then converting the layer into silicon oxide. In other embodiments, the deposited film is created by a radical-oxygen precursor combining with a silicon-and-carbon-containing precursor which has not been directly excited by a plasma. The deposited film would then be a silicon-oxygen-and-carbon-containing film which may experience more shrinkage during subsequent processing compared with a process involving a silicon-and-nitrogen-containing film. Exemplary carbon-containing precursor which does not pass through a plasma may include TMOS, TriMOS, TEOS, OMCTS, HMDS, TMCTR, TMCTS, OMTS, TMS, HMDSO and/or TMDSO. The radical-oxygen precursor comprises plasma effluents created by exciting an oxygen-containing precursor in a plasma and exemplary oxygen-containing precursors may include $O_2$, $O_3$, $N_2O$, NO, $NO_2$, $H_2O_2$, $H_2O$ and $NH_4OH$. Depositing an oxide-rich liner before depositing a gapfill silicon-oxygen-and-carbon-containing layer allows the subsurface oxygen to augment oxygen from an oxygen atmosphere provided during curation.

Embodiments may include multiple annealing stages after curation with different temperatures and atmospheres, in disclosed embodiments. For example, a first heating, stage may be performed at a lower first temperature in an atmosphere that includes steam ($H_2O$), while a second heating stage may be performed at a higher second temperature in a dry oxygen-containing atmosphere which substantially lacks water vapor. The second heating stage may also be conducted in a non-oxygen containing atmosphere (e.g., dry $N_2$, He, Ar, etc.).

Turning now to discuss general properties of liner layers presented herein, oxide-rich liner layers according to disclosed embodiments are thinner than half the width of target trenches in order to allow the subsequently deposited flowable film to flow into the remaining gap. The thickness of the lining layer may be less than or about 100 Å, less than or about 70 Å, less than or about 50 Å or less than or about 30 Å in different embodiments. However, the oxide-rich lining layers are stores of oxygen for redistribution during curation. As such, the thickness should be made large enough to store oxygen in significant quantities for raising the oxygen content in the gapfill dielectric layer. The concentration of the oxygen within the oxide-rich liner should also be large in order to ensure the store of oxygen is sufficient.

The interface between the oxygen-rich liner layer and the gapfill layer is shown as a dotted line in FIGS. 2 (202) and 3B (302). The interface may be essentially eliminated after curing and annealing since the oxygen concentration becomes more homogeneous upon redistribution. Applicants have found the interface to be undetectable, in embodiments, using a cross-sectional SEM. Dotted lines 202 and 302 show where the interface would have been in the absence of curation. FIG. 3A shows a representation of a cross-sectional SEM of a flowable CVD gapfill operation without a liner layer and FIG. 3B shows an identical deposition with a liner layer. Pores are visible 301 in the gapfill region of the deposited layer 304-1 in the absence of an oxide-rich liner layer. On the other hand, neither pores nor an interface is visible in the gapfill region of the deposited layer 304-2 of FIG. 3B.

Oxygen content of the oxide-rich liner may be made larger than the oxygen content of the gapfill layer by adjusting the flow rates of precursors into the remote plasma region. An exemplary flow rate ratio of oxygen ($O_2$) to ammonia ($NH_3$) into the remote plasma region may be about 2:1 (equivalent to an atomic-oxygen-to-nitrogen ratio of about 4:1) during formation of the oxide-rich liner layer. The flow rate ratio of $O_2:NH_3$ may be about 1:5 (equivalent to an atomic-oxygen-to-nitrogen ratio of about 2:5) during the deposition of the gapfill layer. These ratios are indicative of the stoichiometry which would be found in the liner and gapfill layers. In disclosed embodiments, the liner atomic-oxygen-to-nitrogen flow rate ratio exceeds the gapfill atomic-oxygen-to-nitrogen flow rate ratio such that the oxygen content of the oxide-rich liner exceeds that of the gapfill dielectric layer. In another embodiment, the liner atomic-oxygen-to-nitrogen flow rate ratio exceeds the gapfill atomic-oxygen-to-nitrogen, flow rate ratio by a multiplicative factor greater than 5.

During growth of flowable films, the pressure in either the chamber plasma region or the substrate processing region may be below or about 100 Torr, below or about 50 Torr, below or about 20 Torr, below or about 10 Torr or below or about 5 Torr. The pressures in either or both regions may be above or about 0.25 Torr, above or about 0.5 Torr, above or about 1 Torr, above or about 2 Torr or above or about 5 Torr in different embodiments. Each of the lower bounds may be combined with any of the upper bounds on the pressures to form additional ranges of suitable pressures according to disclosed embodiments. The plasma conditions present in the chamber plasma region during the growth of flowable films (to produce radical-oxygen and/or radical-nitrogen precursors) may include an RF power between about 3000 W and about 15,000 W, between about 400 W and about 10,000 W or between about 5000 W and about 8000 W, in disclosed embodiments.

Flowable film growth may proceed while the substrate temperature is maintained at a relatively low temperature during deposition of the silicon-containing films (which include nitrogen and/or carbon in the examples given above. The flowable oxide film may be deposited on the substrate surface at low temperature which is maintained by cooling the substrate during the deposition. The pedestal may include heating and/or cooling conduits inside the pedestal shaft that set the temperature of the pedestal and substrate between about −40° C. and about 200° C., between about 100° C. and about 160° C., less than about 100° C. or less than about 40° C. in different embodiments.

Exemplary Substrate Processing System

Figure 4:
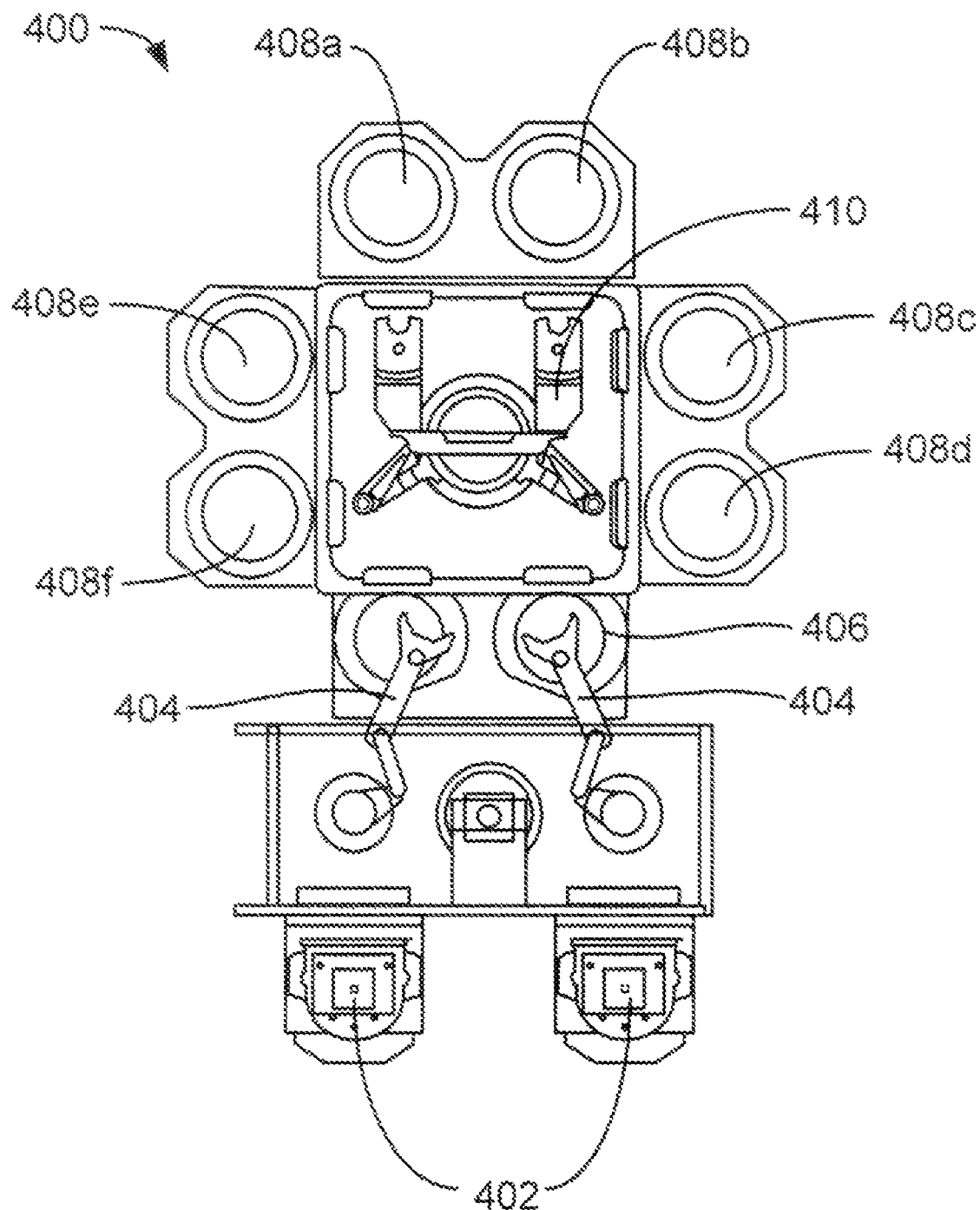
FIG. 4 shows a substrate processing system according to disclosed embodiments.

Embodiments of the deposition systems may be incorporated into larger fabrication systems for producing integrated circuit chips. FIG. 4 shows one such system 400 of deposition, baking and curing chambers according to disclosed embodiments. In the figure, a pair of FOUPs (front opening unified pods) 402 supply substrate substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back.

The processing chambers 408a-f may include one or more system components for depositing, annealing, curing and/or etching a flowable dielectric film on the substrate wafer. In one configuration, two pairs of the processing chamber (e.g., 408c-d and 408e-f) may be used to deposit the flowable dielectric material on the substrate, and the third pair of processing chambers (e.g., 408a-b) may be used to anneal the deposited dielectric. In another configuration, the same two pairs of processing chambers (e.g., 408c-d and 408e-f) may be configured to both deposit and anneal a flowable dielectric film on the substrate, while the third pair of chambers (e.g., 408a-b) may be used for UV or E-beam curing of the deposited film. In still another configuration, all three pairs of chambers (e.g., 408a-f) may be configured to deposit and cure a flowable dielectric film on the substrate. In yet another configuration, two pairs of processing chambers (e.g., 408c-d and 408e-f) may be used for both deposition and UV or E-beam curing of the flowable dielectric, while a third pair of processing chambers (e.g. 408a-b) may be used for annealing the dielectric film. It will be appreciated, that additional configurations of deposition, annealing and curing chambers for flowable dielectric films are contemplated by system 400.

In addition, one or more of the process chambers 408a-f may be configured as a wet treatment chamber. These process chambers include heating the flowable dielectric film in an atmosphere that include moisture. Thus, embodiments of system 400 may include wet treatment chambers 408a-b and anneal processing chambers 408c-d to perform both wet and dry anneals on the deposited dielectric film.

Figure 5A:
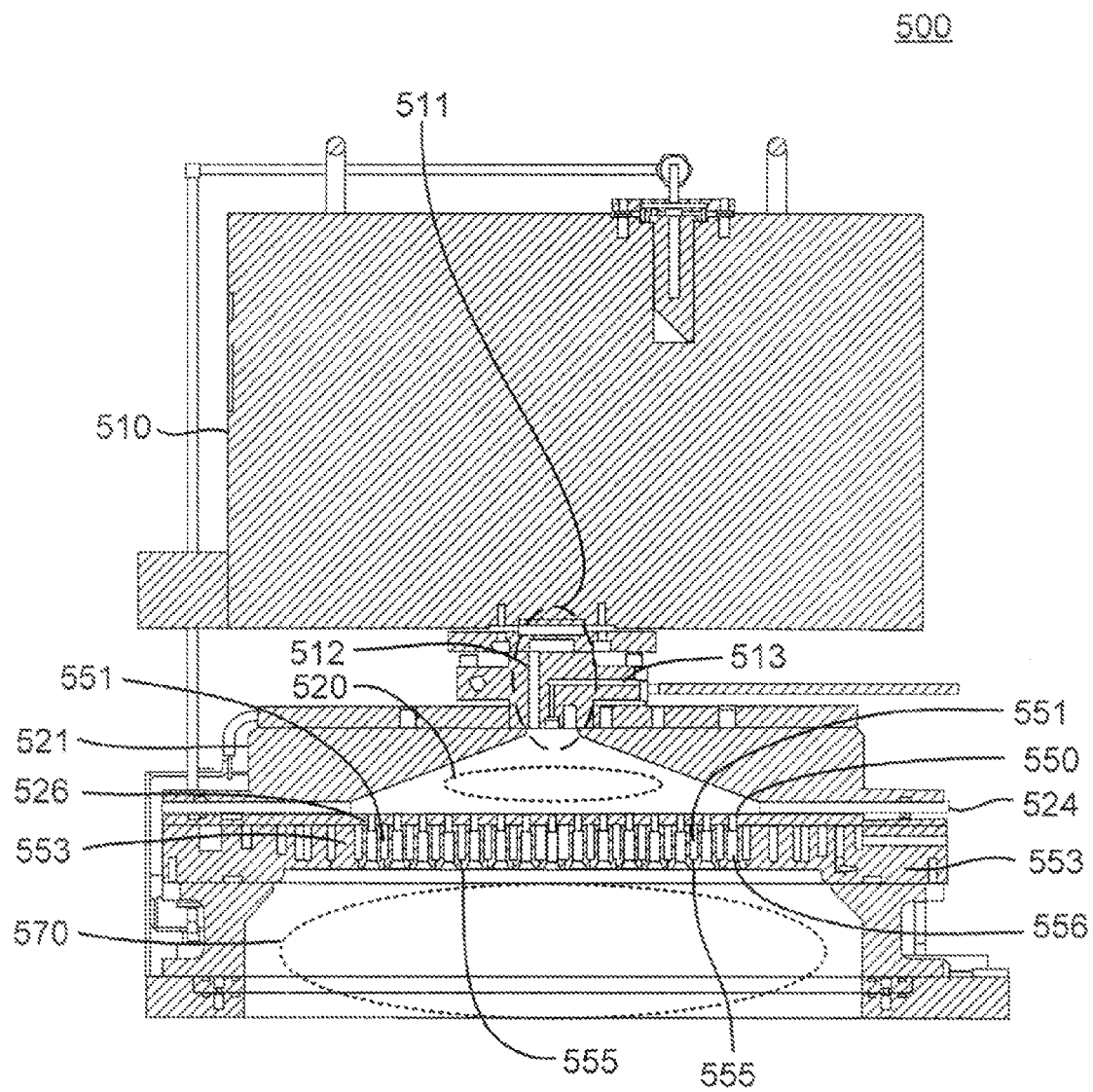
FIG. 5A shows a substrate processing chamber according to disclosed embodiments.

FIG. 5A is a substrate processing chamber 500 according to disclosed embodiments. A remote plasma system (RPS) 510 may process a gas which then travels through a gas inlet assembly 511. Two distinct gas supply channels are visible within the gas inlet assembly 511. A first channel 512 carries a gas that passes through the remote plasma system RPS 510, while a second channel 513 bypasses the RPS 500. The first channel 502 may be used for the process gas and the second channel 513 may be used for a treatment gas in disclosed embodiments. The lid (or conductive top portion) 521 and a perforated partition 553 are shown with an insulating ring 524 in between, which allows an AC potential to be applied to the lid 521 relative to perforated partition 553. The process gas travels through first channel 512 into chamber plasma region 520 and may be excited by a plasma in chamber plasma region 520 alone or in combination with RPS 510. The combination of chamber plasma region 520 and/or RPS 510 may be referred to as a remote plasma system herein. The perforated partition (also referred to as a showerhead) 553 separates chamber plasma region 520 from a substrate processing region 570 beneath showerhead 553. Showerhead 553 allows a plasma present in chamber plasma region 520 to avoid directly exciting gases in substrate processing region 570, while still allowing excited species to travel from chamber plasma region 520 into substrate processing region 570.

Showerhead 553 is positioned between chamber plasma region 520 and substrate processing region 570 and allows plasma effluents (excited derivatives of precursors or other gases) created within chamber plasma region 520 to pass through a plurality of through holes 556 that traverse the thickness of the plate. The showerhead 553 also has one or more hollow volumes 551 which can be filled with a precursor in the form of a vapor or gas (such as a silicon-containing precursor) and pass through small holes 555 into substrate processing region 570 but not directly into chamber plasma region 520. Showerhead 553 is thicker than the length of the smallest diameter 550 of the through-holes 556 in this disclosed embodiment. In order to maintain a significant concentration of excited species penetrating from chamber plasma region 520 to substrate processing region 570, the length 526 of the smallest diameter 550 of the through-holes may be restricted by forming larger diameter portions of through-holes 556 part way through the showerhead 553. The length of the smallest diameter 550 of the through-holes 556 may be the same order of magnitude as the smallest diameter of the through-holes 556 or less in disclosed embodiments.

In the embodiment shown, showerhead 553 may distribute (via through holes 556) process gases which contain oxygen, hydrogen and/or nitrogen and/or plasma effluents of such process gases upon excitation by a plasma in chamber plasma region 520. In embodiments, the process gas introduced into the RPS 510 and/or chamber plasma region 520 through first channel 512 may contain one or more of oxygen ($O_2$), ozone ($O_3$), $N_2O$, $NO$, $NO_2$, $NH_3$, $N_xH_y$ including $N_2H_4$, silane, disilane, TSA and DSA. The ratio of oxygen to nitrogen flowing through RPS 510 may be relatively high during the deposition of the oxide-rich liner layer and reduced during the deposition of the gapfill dielectric layer. The process gas may also include a carrier gas such as helium, argon, nitrogen ($N_2$), etc. The second channel 513 may also deliver a process gas and/or a carrier gas, and/or a film-curing gas used to remove an unwanted component from the growing or as-deposited film. Plasma effluents may include ionized or neutral derivatives of the process gas and may also be referred to herein as a radical-oxygen precursor and/or a radical-nitrogen precursor referring to the atomic constituents of the process gas introduced.

In embodiments, the number of through-holes 556 may be between about 60 and about 2000. Through-holes 556 may have a variety of shapes but are most easily made round. The smallest diameter 550 of through holes 556 may be between about 0.5 mm and about 20 mm or between about 1 mm and about 6 mm in disclosed embodiments. There is also latitude in choosing the cross-sectional shape of through-holes, which may be, made conical, cylindrical or a combination of the two shapes. The number of small holes 555 used to introduce a gas into substrate processing region 570 may be between about 100 and about 5000 or between about 500 and about 2000 in different embodiments. The diameter of the small holes 555 may be between about 0.1 mm and about 2 mm.

Figure 5B:
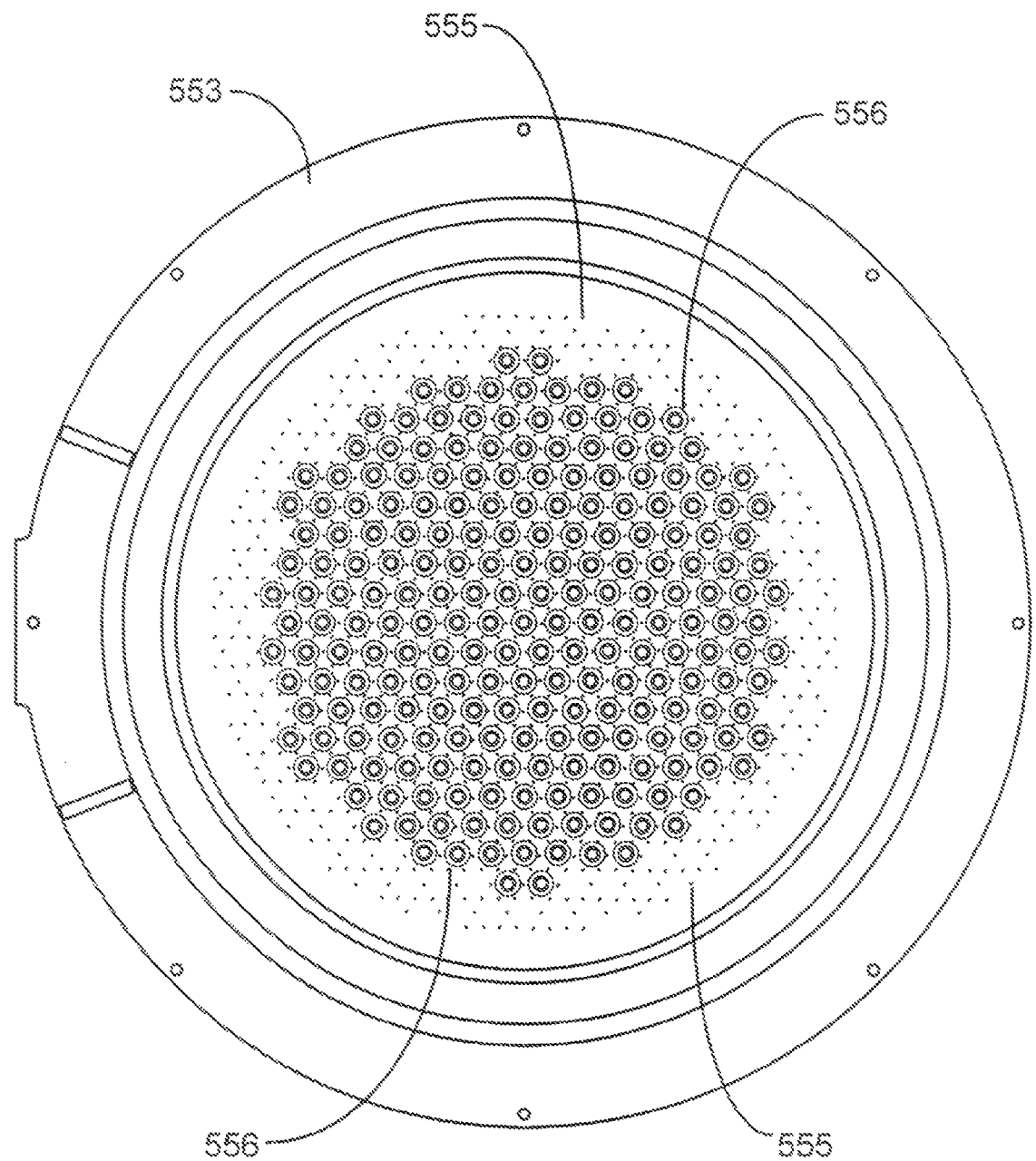
FIG. 5B shows a showerhead of a substrate processing chamber according to disclosed embodiments.

FIG. 5B is a bottom view of a showerhead 553 for use with a processing chamber according to disclosed embodiments. Showerhead 553 corresponds with the showerhead shown in FIG. 5A. Through-holes 556 are depicted with a larger inner-diameter (ID) on the bottom of showerhead 553 and a smaller ID at the top. Small holes 555 are distributed substantially evenly over the surface of the showerhead, even amongst the through-holes 556 which helps to provide more even mixing than other embodiments described herein.

An exemplary film is created on a substrate supported by a pedestal (not shown) within substrate processing region 570 when plasma effluents arriving through through-holes 556 in showerhead 553 combine with a silicon-containing precursor arriving through the small holes 555 originating from hollow volumes 551. Though substrate processing region 570 may be equipped to support a plasma for other processes such as curing, no plasma is present during the growth of the exemplary film.

A plasma may be ignited either in chamber plasma region 520 above showerhead 553 or substrate processing region 570 below showerhead 553. An AC voltage typically in the radio frequency (RF) range is applied between the conductive top portion 521 of the processing chamber and showerhead 553 to ignite a plasma in chamber plasma region 520 during deposition. The top plasma is left at low or no power when the bottom plasma in the substrate processing region 570 is turned on to either cure a film or clean the interior surfaces bordering substrate processing region 570. A plasma in substrate processing region 570 is ignited by applying an AC voltage between showerhead 553 and the pedestal or bottom of the chamber. A cleaning gas may be introduced into substrate processing region, 570 while the plasma is present.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the CVD machine. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text, is in a high level language, the code is compiled, and the resultant compiler code is then linked with an object code of precompiled. Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

In embodiments employing a chamber plasma region, the excited plasma effluents are generated in a section of the substrate processing region partitioned from a deposition region where, the plasma effluents mix and react with the carbon-free silicon-containing precursor to deposit the silicon-and-nitrogen layer on a deposition substrate (e.g., a semiconductor wafer). The excited plasma effluents are also accompanied by an inert gases (in the exemplary case, argon). The carbon-free silicon-containing precursor does not pass through a plasma before entering the substrate plasma region, in embodiments. The radical nitrogen precursor is created in the remote plasma region and travels into the substrate processing region where the silicon-containing precursor is excited by the radical nitrogen precursor. In embodiments, the silicon-containing precursor is excited only by the radical nitrogen precursor. Plasma power may essentially be applied only to the remote plasma region, in embodiments, to ensure that the radical nitrogen precursor provides the predominant excitation to the silicon-containing precursor. The substrate processing region may be described herein as "plasma-free" during the growth of the silicon-and-nitrogen-containing layer and during the low temperature ozone cure. "Plasma-free" does not necessarily mean the region is devoid of plasma. Ionized species and free electrons created within the plasma region do travel through pores (apertures) in the partition (showerhead) but the carbon-free silicon-containing precursor is not substantially excited by the plasma power applied to the plasma region. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film. All causes for a plasma having much lower intensity ion density than the chamber plasma region (or a remote plasma region, for that matter) during the creation of the excited plasma effluents do not deviate from the scope of "plasma-free" as used herein.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon oxide" is used as a shorthand for and interchangeably with a silicon-and-oxygen-containing material. As such, silicon oxide may include concentrations of other elemental constituents such as nitrogen, hydrogen, carbon and the like. In some embodiments, silicon oxide consists essentially of silicon and oxygen. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A "gas" (or a "precursor") may be a combination of two or more gases (or "precursors") and may include substances which are normally liquid or solid but temporarily carried along with other "carrier gases." A "radical precursor" is used to describe plasma effluents (a gas in an excited state which is exiting a plasma) which participate in a reaction to either remove material from or deposit material on a surface. A "radical-nitrogen precursor" is a radical precursor which contains nitrogen and a "radical-hydrogen precursor" is a radical precursor which contains hydrogen. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "trench" is used throughout with no implication that the etched geometry has a large horizontal aspect ratio. Viewed from above the surface, trenches may appear circular, oval, polygonal, rectangular, or a variety of, other shapes. The term "via" is used to refer to a low aspect ratio trench (as viewed from above) which may or may not be filled with metal to form a vertical electrical connection. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon oxide layer on a patterned substrate containing a trench, the method comprising:
    transferring the substrate into a substrate processing chamber;
    forming an oxygen-rich liner layer on the substrate including in the trench;
    forming a gapfill dielectric layer on the substrate and in the trench, wherein the gapfill dielectric layer has a lower oxygen content than the oxygen-rich liner layer and the gapfill dielectric layer is flowable during formation; and curing the gapfill dielectric layer at an elevated temperature to transfer some of the oxygen from the oxygen-rich liner layer into the gapfill dielectric layer.

2. The method of claim 1, wherein the oxygen-rich liner layer is more conformal than the gapfill dielectric layer.

3. The method of claim 1, wherein the gapfill dielectric layer substantially tills the trench.

4. The method of claim 1, wherein forming the gapfill dielectric layer comprises:

flowing a gapfill plasma precursor into a remote plasma region to form plasma effluents; and combining the plasma effluents with a flow of a silicon-containing precursor in the substrate processing region to form the gapfill dielectric layer, wherein the silicon-containing precursor is not directly excited by an application of plasma power and the gapfill dielectric layer is a silicon-and-oxygen-containing layer.

5. The method of claim 1, wherein forming the oxygen-rich liner layer comprises:

flowing a liner plasma precursor into a remote plasma region to form plasma effluents; and combining the plasma effluents with a flow of a silicon-containing precursor in the substrate processing region to form the oxygen-rich liner layer, wherein the silicon-containing precursor is not directly excited by an application of plasma power and the gapfill dielectric layer is a silicon-and-oxygen-containing layer.

6. The method of claim 4, wherein the operation of flowing the gapfill plasma precursor comprises flowing oxygen and nitrogen into the remote plasma region with a gapfill atomic oxygen-to-nitrogen flow rate ratio.

7. The method of claim 5, wherein the operation of flowing the liner plasma precursor comprises flowing oxygen and nitrogen into the remote plasma, region with a liner atomic-oxygen-to-nitrogen flow rate ratio.

8. The method of claim 7, wherein the liner atomic-oxygen-to-nitrogen flow rate ratio exceeds the gapfill atomic-oxygen-to-nitrogen flow rate ratio such that the oxygen content of the oxide-rich liner exceeds that of the gapfill dielectric layer.

9. The method of claim 8, wherein the liner atomic-oxygen-to-nitrogen flow rate ratio exceeds the gapfill atomic-oxygen-to-nitrogen flow rate ratio by a multiplicative factor greater than 5.

10. The method of claim 4, wherein the silicon-containing precursor comprises a silicon-and-nitrogen-containing precursor and the plasma effluents comprise a radical-nitrogen precursor.

11. The method of claim 10, wherein the silicon-and-nitrogen-containing precursor comprises at least one of $H_2N(SiH_3)$, $HN(SiH_3)_2$, and $N(SiH_3)_3$ and the plasma precursor comprises at least one of $NH_3$, $NH_4OH$, $N_2O$, $NO$, $NO_2$, $N_2$ and $H_2$.

12. The method of claim 4, wherein the remote plasma region is within the substrate processing chamber and separated from the substrate processing chamber by a showerhead.

13. The method of claim 1, wherein the operation of curing the gapfill dielectric layer comprises exposing the gapfill dielectric layer to an ozone-containing atmosphere at the elevated temperature.

14. The method of claim 13, wherein the operation of curing the gapfill dielectric layer further comprises subsequently exposing the gapfill dielectric layer to an oxygen-containing atmosphere comprising at least one of $O_2$, $O_3$ and $H_2O$, at an annealing temperature greater than the elevated temperature.

15. The method of claim 1, wherein the trench has a width of about 50 nm or less.

* * * * *

UNITED STATES PATENT AND TRADEMARK OFFICE
CERTIFICATE OF CORRECTION

PATENT NO. : 8,318,584 B2
APPLICATION NO. : 13/153016
DATED : November 27, 2012
INVENTOR(S) : DongQing Li, Jingmei Liang and Nitin K. Ingle Page 1 of 1

It is certified that error appears in the above-identified patent and that said Letters Patent is hereby corrected as shown below:

Claim 3, Column 13, line 9, delete "tills" and insert --fills--.

Signed and Sealed this
Twenty-sixth Day of February, 2013

Teresa Stanek Rea
*Acting Director of the United States Patent and Trademark Office*